United States Patent
Matsubara

(10) Patent No.: US 10,854,464 B2
(45) Date of Patent: *Dec. 1, 2020

(54) MANUFACTURING PROCESS OF ELEMENTAL CHIP

(71) Applicant: Panasonic Intellectual Property Management Co., Ltd., Osaka (JP)

(72) Inventor: Noriyuki Matsubara, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/528,936

(22) Filed: Aug. 1, 2019

(65) Prior Publication Data

US 2019/0355586 A1 Nov. 21, 2019

Related U.S. Application Data

(63) Continuation of application No. 15/682,814, filed on Aug. 22, 2017, now Pat. No. 10,424,486.

(30) Foreign Application Priority Data

Sep. 26, 2016 (JP) ................................ 2016-187024

(51) Int. Cl.
*H01L 21/3065* (2006.01)
*H01L 21/311* (2006.01)
(Continued)

(52) U.S. Cl.
CPC .......... *H01L 21/3065* (2013.01); *G03F 7/039* (2013.01); *G03F 7/091* (2013.01);
(Continued)

(58) Field of Classification Search
None
See application file for complete search history.

(56) References Cited

U.S. PATENT DOCUMENTS

2003/0211756 A1 11/2003 Ito et al.
2005/0074552 A1* 4/2005 Ge .......................... G03F 7/162
427/240

(Continued)

FOREIGN PATENT DOCUMENTS

JP 2003-297725 A 10/2003
JP 2006-106783 A 4/2006
(Continued)

OTHER PUBLICATIONS

Japanese Decision to Refuse dated Jul. 16, 2019 issued in the corresponding Japanese Patent Application No. 2016-187024.

*Primary Examiner* — Stephanie P Duclair
(74) *Attorney, Agent, or Firm* — Pearne & Gordon LLP

(57) ABSTRACT

A manufacturing process of an elemental chip includes steps of preparing a substrate held on the holding tape, the substrate including first and second sides opposite each other and the second side thereof being held on the holding tape, and the substrate further including a plurality of element regions and a plurality of segmentation regions defining each of the element regions; setting a nozzle to have a length between a lower most edge of the nozzle and the first side of the substrate in a range between 20 mm and 150 mm, spraying a resist solution to form droplets of the resist solution, the resist solution containing a resist constituent and a solvent; forming a resist layer by vaporizing the solvent from the droplets and depositing the resist constituent on the first side of the substrate that is held on the holding tape such that an amount of the solvent remained in the resist layer to be in a range between 5 wt. % and 20 wt. %; patterning the resist layer to expose the first side of the
(Continued)

substrate in the segmentation regions; and plasma-etching the first side of the substrate exposed in the segmentation regions thereof.

7 Claims, 11 Drawing Sheets

(51) Int. Cl.
| | | |
|---|---|---|
| *G03F 7/09* | (2006.01) | |
| *H01L 21/308* | (2006.01) | |
| *H01L 21/78* | (2006.01) | |
| *H01L 21/027* | (2006.01) | |
| *H01L 21/32* | (2006.01) | |
| *H01L 21/3213* | (2006.01) | |
| *G03F 7/039* | (2006.01) | |
| *H01L 21/683* | (2006.01) | |

(52) U.S. Cl.
CPC ........ *H01L 21/0274* (2013.01); *H01L 21/308* (2013.01); *H01L 21/3086* (2013.01); *H01L 21/31138* (2013.01); *H01L 21/32* (2013.01); *H01L 21/32136* (2013.01); *H01L 21/6836* (2013.01); *H01L 21/78* (2013.01); *H01L 2221/6834* (2013.01); *H01L 2221/68318* (2013.01); *H01L 2221/68327* (2013.01)

(56) References Cited

U.S. PATENT DOCUMENTS

| | | |
|---|---|---|
| 2015/0221505 A1 | 8/2015 | Park et al. |
| 2015/0255349 A1 | 9/2015 | Holden et al. |

FOREIGN PATENT DOCUMENTS

| | | |
|---|---|---|
| JP | 2007-073916 A | 3/2007 |
| JP | 2007-079589 A | 3/2007 |
| JP | 2007-156465 A | 6/2007 |
| JP | 2012-235130 A | 11/2012 |
| JP | 2015-142026 A | 8/2015 |
| JP | 2016-048715 A | 4/2016 |

* cited by examiner

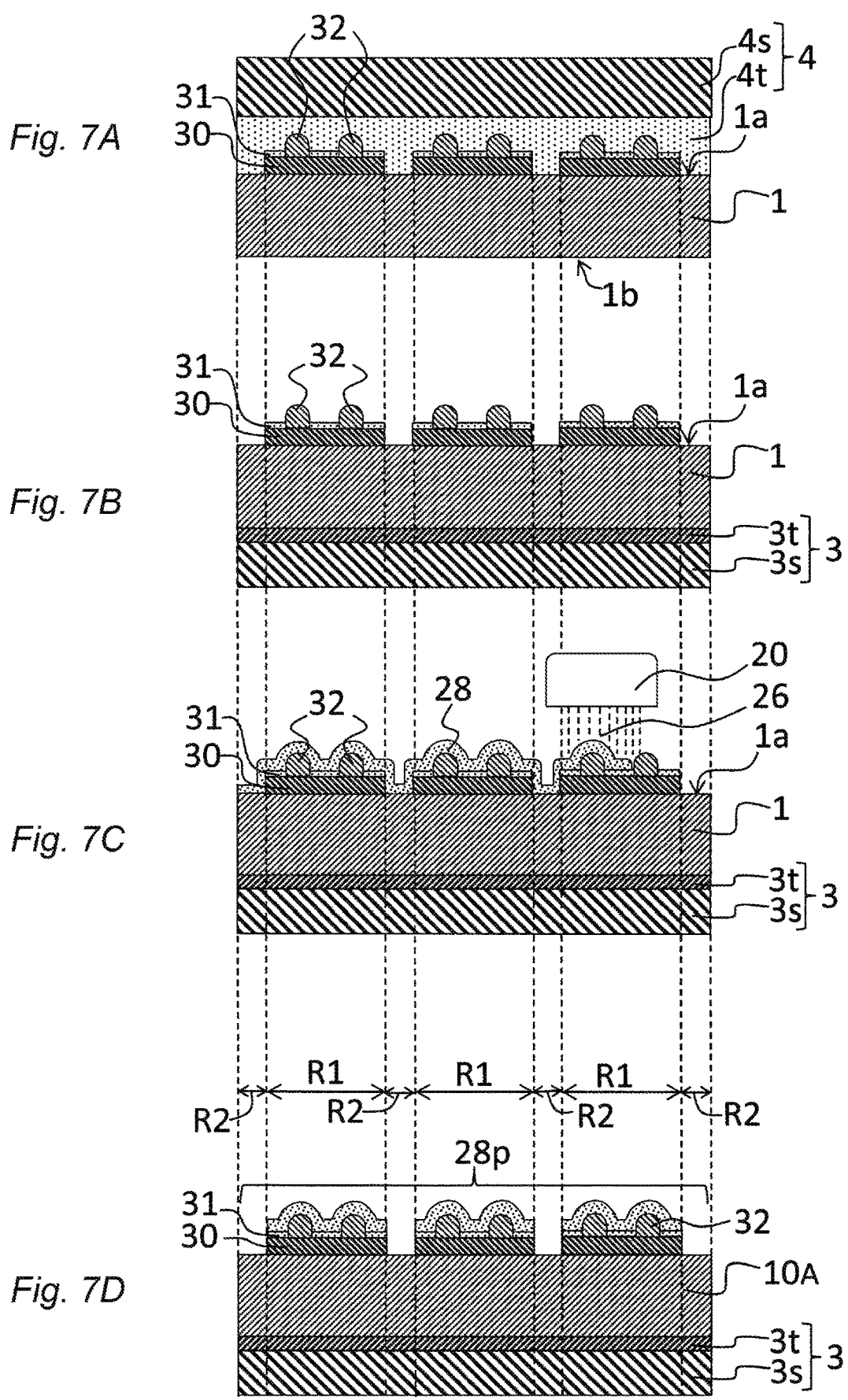

MANUFACTURING PROCESS OF ELEMENTAL CHIP

CROSS REFERENCE TO RELATED APPLICATION

The present application is a continuation of U.S. application Ser. No. 15/682,814 filed on Aug. 22, 2017 which claims priority under 35 U.S.C. § 119 with respect to the Japanese Patent Application No. 2016-187024, filed on Sep. 26, 2016. The entire content of both applications is incorporated herein by reference.

TECHNICAL FIELD

The present invention relates to a manufacturing process of an elemental chip, which includes a step for plasma-etching a substrate which is held on a holding tape.

BACKGROUND

Various processes for forming a resist pattern on a surface of a substrate are known. The substrate has a thickness which recently tends to be thinner. The thinner substrate makes handling more difficult. Patent Document 1 (JP 2015-142026, A) suggests an electrostatic-stick carrier that electrostatically sticks the substrate thereon for ease of handling. In this case, while the substrate is stuck on the electrostatic-stick carrier, several following steps including formation of a resist layer, exposure, and development.

On the other hand, in the technical field for etching the substrate within a plasma atmosphere, Patent Document 2 (JP 2016-048715, A) suggests that after forming the resist pattern on the substrate, the substrate is held on a tape supported by a frame by adhering the substrate and the frame on the tape.

However, when forming the resist pattern, the electrostatic-stick carrier likely causes the several steps on the sucked substrate complicated. Also, the electrostatic-stick carrier requires a substantial cost to be applied in a mass-production process of the elemental chips.

In the meanwhile, when etching the substrate within the plasma atmosphere, it is much easier to handle the substrate if the substrate could be held on the adhering or holding tape before forming the resist pattern on the substrate. However, in order to form the resist pattern, after application of a resist solution on the side of the substrate by means of a spin-coating process, a coating layer before exposure is required to be baked (or heated) at a temperature of, for example, 90 degrees Celsius. The solvent remains in the coating layer more than permissible range at the lower baking temperature, which substantially degrades an accuracy of the resist patterning. However, on the other hand, when the coating layer is baked at a temperature high enough to form the resist patterning, the adhering or holding tape having low heat-resistant temperature deteriorates so that the inherent functions thereof cannot be achieved any more.

SUMMARY

To address the aforementioned drawbacks, one aspect of the present invention provides a manufacturing process of an elemental chip, which comprises:

a preparation step for preparing a substrate held on a holding tape, the substrate including first and second sides opposite each other and the second side thereof being held on the holding tape, and the substrate further including a plurality of element regions and a plurality of segmentation regions defining each of the element regions;

a setting step for setting a nozzle, a length between a lower most edge of the nozzle and the first side of the substrate being in a range between 20 mm and 150 mm, a spray step for spraying a resist solution to form droplets of the resist solution, the resist solution containing a resist constituent and a solvent;

a layer-formation step for forming a resist layer by vaporizing the solvent from the droplets and depositing the resist constituent on the first side of the substrate that is held on the holding tape such that an amount of the solvent remained in the resist layer to be in a range between 5 wt. % and 20 wt. %;

a patterning step for patterning the resist layer to expose the first side of the substrate in the segmentation regions; and an etching step for plasma-etching the substrate on the first side exposed in the segmentation regions thereof.

BRIEF DESCRIPTION OF THE DRAWINGS

FIGS. 7A-7D are operation charts illustrating early steps of the manufacturing process of the elemental chips depicted in FIG. 6.

DETAILED DESCRIPTION

Figure 1A:
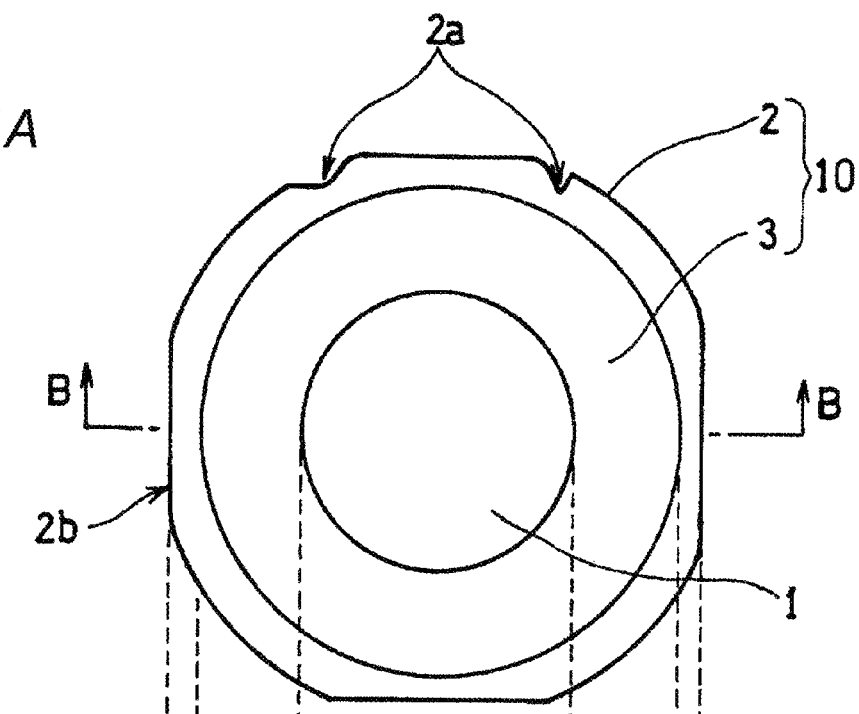
FIG. 1A is a top plan view schematically depicting an exemplary substrate held on the holding tape.

The manufacturing process of the elemental chips according to one embodiment of the present invention includes, (i) a preparation step for preparing a substrate held on a holding tape, (ii) a setting step for setting a nozzle for spraying a resist solution, (iii) a spray step for spraying the resist solution from the nozzle towards a predetermined surface of the substrate, (iv) a layer-formation step for forming a resist layer by depositing a resist constituent on a surface of the substrate, (v) a patterning step for patterning the resist layer, and (vi) an etching step for etching the substrate within the plasma atmosphere.

The substrate prepared in the preparation step (i) includes first and second surfaces opposite each other, and it also includes a plurality of element regions and a plurality of segmentation regions defining each of the element regions. The substrate is held on a holding tape by adhering the second surfaces of the substrate thereon, prior to forming the resist layer. An annular frame is also held on the holding tape at the peripheral portion thereof. The present disclosure may refer a combination of the holding tape and the frame as a conveying carrier. The substrate held on the holding tape substantially facilitates the handling thereof in the following operation steps, even if the substrate is rather thin.

The setting step (ii) is one for setting a nozzle to have a length between a lower most edge of the nozzle and the first side of the substrate in a range between 20 mm and 150 mm.

The spray step (iii) is one for spraying a resist solution from the nozzle towards a predetermined surface of the substrate so as to form the droplets of the resist solution thereon. The resist solution contains the resist constituent and a solvent. The resist constituent may be either positive or negative, which would not limit the scope of the present invention.

The layer-formation step (iv) is one for forming the resist layer by depositing the resist constituent on the first side of the substrate which is held on the holding tape. Vaporization of the solvent from the droplets of the resist solution possibly reduces a substantial amount of the solvent remained in the resist layer. In the layer-formation step, the amount of the solvent remained in the resist layer may preferably be controlled in a range between about 5 wt. % and about 20 wt. %. The amount of the solvent to be vaporized may be controlled by selection of the droplet size to be formed and the circumstance around the droplets in the spray step. Any appropriate droplet size and the circumstance around the droplets may be determined in accordance with the types of the solvents and desired thickness of the resist layer.

The patterning step (v) is one for patterning the resist layer so as to expose the first surface of the substrate in the segmentation regions. Since the amount of the solvent remained in the resist layer has been reduced, another baking step to heat the resist layer prior to the patterning step is not required. In this context, the "patterning step" may include, for example, an exposure step and a development step of the resist layer, and a cleaning step after the development step.

When the etchant contacts with the resist layer on the substrate after the exposure step, the resist layer in the segmentation regions dissolves with the etchant so that a predetermined patterning is developed on the first side of the substrate. The etchant and the resist constituent dissolved therein are removed by cleaning for example with pure water.

It should be noted that the patterning step may be achieved by means of the laser scribing technique. In this case, the resist layer in the segmentation regions on the first side of the substrate may be removed on which the laser beam is irradiated, so that a predetermined patterning of the resist layer is defined.

The etching step (vi) is one for plasma-etching the first side of the substrate in the segmentation regions by exposing the substrate in the segmentation regions to the plasma atmosphere, in which the resist layer has been removed in the patterning step. The etching step (v) may be performed with the substrate being held on the holding tape which is installed on a stage provided within a given dry etching apparatus.

The dry etching apparatus includes a chamber of which inside defines a processing space. The stage supporting the substrate is provided in the processing space. During the etching step, the atmosphere containing a given processing gas is defined around the substrate in the processing space. Then, a high-frequency power is applied onto the processing gas so as to generate the plasma thereof. The segmentation regions of the substrate are etched by such generated plasma of the processing gas.

The tape for holding the substrate has the heat-resistant temperature which is typically about 60 degrees Celsius. As described above, since the aforementioned process requires no baking step of the resist layer, the substrate and the holding tape can be maintained at 50 degrees Celsius or less at least during a time window between the beginning of the spray step (iii) and the beginning of the patterning step (v).

Preferably, the substrate and the holding tape may be kept at 50 degrees Celsius or less also during a time window between the beginning of the patterning step (v) and the end of the patterning step (v). Thus, the substrate and the holding tape may preferably be kept at 50 degrees Celsius or less through the beginning of the preparation step (i) to the end of the etching step (v).

Furthermore, the resist layer may be exposed at a pressure less than the atmospheric pressure (for example, 100 Pa or less) during a time window between the end of the layer-formation step (iv) and the beginning of the patterning step (v). The lower pressure may further reduce the solvent remained in the resist layer, which improves the accuracy of the patterning.

Also, after the substrate held on the holding tape is installed on the stage of the processing chamber and before etched in the plasma atmosphere, the chamber may be depressurized in order to enhance the accuracy of the plasma etching. This leads further reduction of the solvent remained in the resist pattern or layer.

With reference to attached drawings, embodiments of the present inventions will be described in detail hereinafter.

Figure 1B:
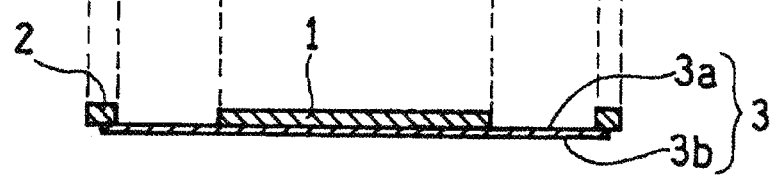
FIG. 1B is a cross-sectional view thereof taken along a line B-B indicated in FIG. 1A.

[Conveying Carrier] FIG. 1A is a top plan view schematically illustrating the substrate 1 and the conveying carrier 10 holding the substrate 1. FIG. 1B is a cross-sectional view of the substrate 1 and the conveying carrier 10, taken along a B-B line of FIG. 1A. As illustrated in FIG. 1A, the conveying carrier 10 includes the frame 2 and the holding tape 3. The holding tape 3 has a peripheral on which the frame 2 is held or adhered. Also, the substrate 1 is held or adhered on the holding tape 3. It should be noted that although the substrate 1 and the frame 2 are depicted as having a substantially circular shape, the present invention may not be limited to the shape thereof.

The holding tape 3 includes one side 3a having an adhesive compound (adhesive side) and another side 3b having no adhesive compound (non-adhesive side). The peripheral of the adhesive side 3a is adhered on one or bottom side of the annular frame so that the holding tape 3 is uncovered or exposed by an opening of the frame 2. The substrate 1 is held on the holding tape 3 with the exposed portion of the adhesive side 3a thereof being adhered on the substrate 1.

The adhesive side 3a may preferably contain the adhesive compound of which adhesibility is weakened with an ultraviolet beam (UV-radiation). This allows each of electrical elements or chips obtained by dicing the substrate to easily be peeled off and picked up from the adhesive side 3a with the UV-radiation. The adhesive layer 3t may be formed, for example, by applying an UV-curing acrylic adhesive compound on a side of a backing film 3s so as to have a thickness of 5-20 μm (see, e.g., FIGS. 5A-5F).

The compounds of the backing film 3s may include, although not limited thereto, a thermoplastic resin such as polyethylene, polyolefin (e.g., polypropylene), and polyester (e.g., polyethylene terephthalate). Also, the backing film 3s may include a rubber component for adding a stretching property, including for example, ethylene-propylene (EPM) rubber, ethylene-propylene-diene (EPDM) rubber, and also may include various additives such as a plasticizer, a flexibilizer, an antioxidant, and a conductive compound. The thermoplastic resin may contain a functional group such as acrylic group reacting with photopolymerization. The backing film 3s has a thickness, for example, in a range between 50 μm and 150 μm. During the plasma-etching, the conveying carrier 10 is installed on the stage so that the stage and the non-adhesive side 3b contact to each other.

The holding tape 3 may be in contact with a developing solution and a rinse solution during the succeeding patterning step. However, the developing solution and the rinse solution do not cause deterioration of at least portions of the adhesive compound where the second side of the substrate 1 and the frame 2 connect to each other, as well as the backing film 3s made of material as described above.

The frame 2 is an annular rim body with the opening having an area same as or greater than the outline of the substrate 1, and has a predetermined width and a reduced but substantially constant thickness. The frame 2 has a stiffness enough such that it can carry the substrate 1 being held on the holding tape 3

The opening of the frame 2 may be configured, although not limited thereto, to have a circular, rectangular, hexagonal, or polygonal shape. Also, the frame 2 may have a notch 2a and a corner-cut 2b for alignment. The frame 2 may be made of, for example, a metal such as aluminum and stainless steel, and a resin. A lower side of the frame 2 is adhered on the adhesive side 3a of the holding tape 3 at the peripheral thereof.

[Substrate] The substrate 1 is subjected to the plasma-etching. The substrate 1 may include various types of electrical circuits, and although not limited thereto, may be one of a semiconductor substrate such as a silicon wafer, a resin substrate such as a flexible printed board, or a ceramics substrate. The semiconductor substrate may be made of, for example, silicon (Si), gallium arsenide (GaAs), gallium nitride (GaN), or silicon carbide (SiC).

The semiconductor substrate may include circuit layers on the first side, including a semiconductor circuit, electronic element, and MEMS (Micro-Electro-Mechanical System). The circuit layers typically contain an insulating layer, besides also may include a metal material, a resin protective layer, and a pad electrode. The insulating layer may be incorporated in a laminated body (multiple wiring layers) with a wiring metal material. The insulating layer may contain, for example, silicon dioxide ($SiO_2$), silicon nitride ($Si_3N_4$), a low-permittivity layer (a low-k layer), a resin layer such as a polyimide layer, lithium tantalate ($LiTaO_3$), and lithium niobate ($LiNbO_3$). The semiconductor substrate may be produced by preparing the circuit layers and grinding the rear side opposite to the side having the circuit layers so as to make the substrate thinner.

Although the diameter of the substrate 1 is not limited thereto, the maximum diameter thereof may be in a range between about 50 mm and 300 mm. The substrate 1 has the thickness typically of 150 μm or less, often of 100 μm or less, and possibly 10 μm or less. The thinner substrate causes the higher superiority or availability of the plasma-etching step for separating the substrate 1 into the individual elemental chips.

Also, although not limited thereto, the shape of the substrate 1 may be, for example, circular and rectangular. Furthermore, the substrate 1 may be provided with an orientation flat and/or a cutout such as a notch (not shown).

[Spray Application Apparatus] The spray step and the layer-formation step described later may be achieved by means of a spray application apparatus. Any types of the spray application apparatuses may be used as far as it can spray the resist solution. The spray application apparatus may be an ink-jet type or an electrostatic type. The ink-jet spray application apparatus is designed for ejecting the resist solution onto the first side of the substrate and depositing the droplets of the resist solution. The electrostatic spray application apparatus is configured to spray the charged resist solution onto the first side of the substrate charged with a reverse polarity.

In order to make the solvent quickly vaporized from the droplets of the sprayed resist solution, the sprayed droplet size may be in a range preferably between 10 nm and 1000 nm, and more preferably between 10 nm and 100 nm.

Figure 2A:
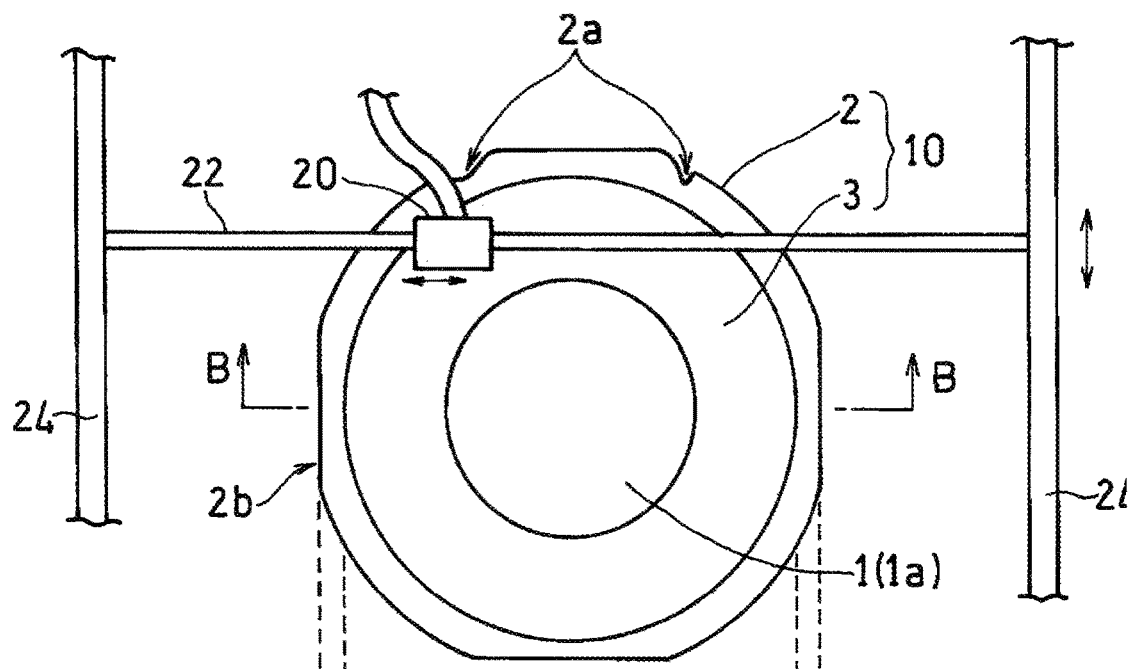
FIGS. 2A and 2B are a conceptual view depicting a schematic structure of an exemplary spray-application apparatus.
Figure 2B:
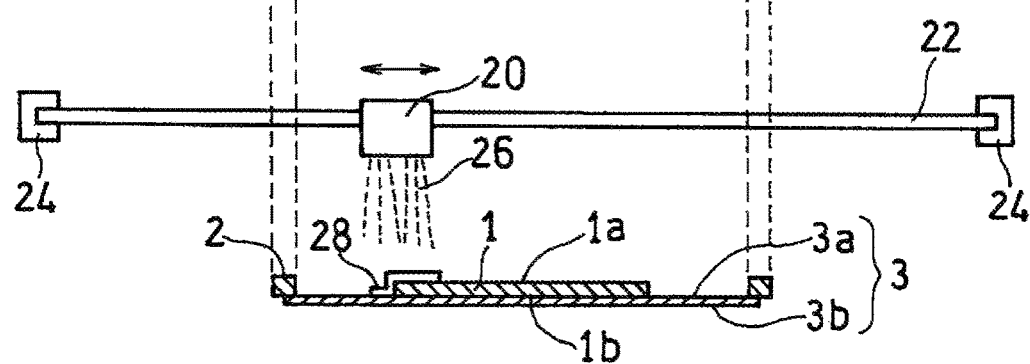

FIGS. 2A and 2B are a conceptual view depicting a schematic structure of an exemplary spray application apparatus. The spray application apparatus as shown includes a nozzle 20 having a plurality of spray orifices for spraying the resist solution, and transverse and vertical rails 22, 24 for transferring the nozzle 20 in transverse and vertical directions, respectively. The nozzle 20 moves along each rail in the transverse and vertical directions and sprays the resist solution towards the first side 1a of the substrate 1 held on the holding tape 3, in accordance with instructions from the controller (not shown).

Immediately after the solvent solution is sprayed, the solvent initiates vaporizing from the droplet 26 of the solvent solution, and when the droplet 26 reaches to the first side 1a, the solvent is reduced at such a level that it does not prevent the patterning by exposure and development of the resist layer 28, or the patterning by laser scribing of the resist layer 28.

As the length L between the lowermost edge of the nozzle 20 for spraying the resist solution and the first side 1a of the substrate 1 is greater, it is more advantageous to vaporizing the solution. However, when the length L is redundant, the resist solution is sprayed beyond the regions where it should be sprayed on the first side 1a, thereby requiring more amount of the resist solution to be sprayed. The length L between the lowermost edge of the nozzle 20 and the first side 1a of the substrate 1 may preferably be in a range between 20 mm and 150 mm.

The resist solution may be sprayed to form the droplets in an atmosphere but preferably in a dry air circumstance having a dew point between −20 degrees and −10 degrees Celsius. The dry air circumstance facilitates more sufficient amount of the solvent to vaporize more quickly from the droplets. Thus, this minimizes the length L between the lowermost edge of the nozzle 20 and the first side 1a of the substrate 1, thereby to reduce the amount of the resist solution required for spaying.

Figure 3:
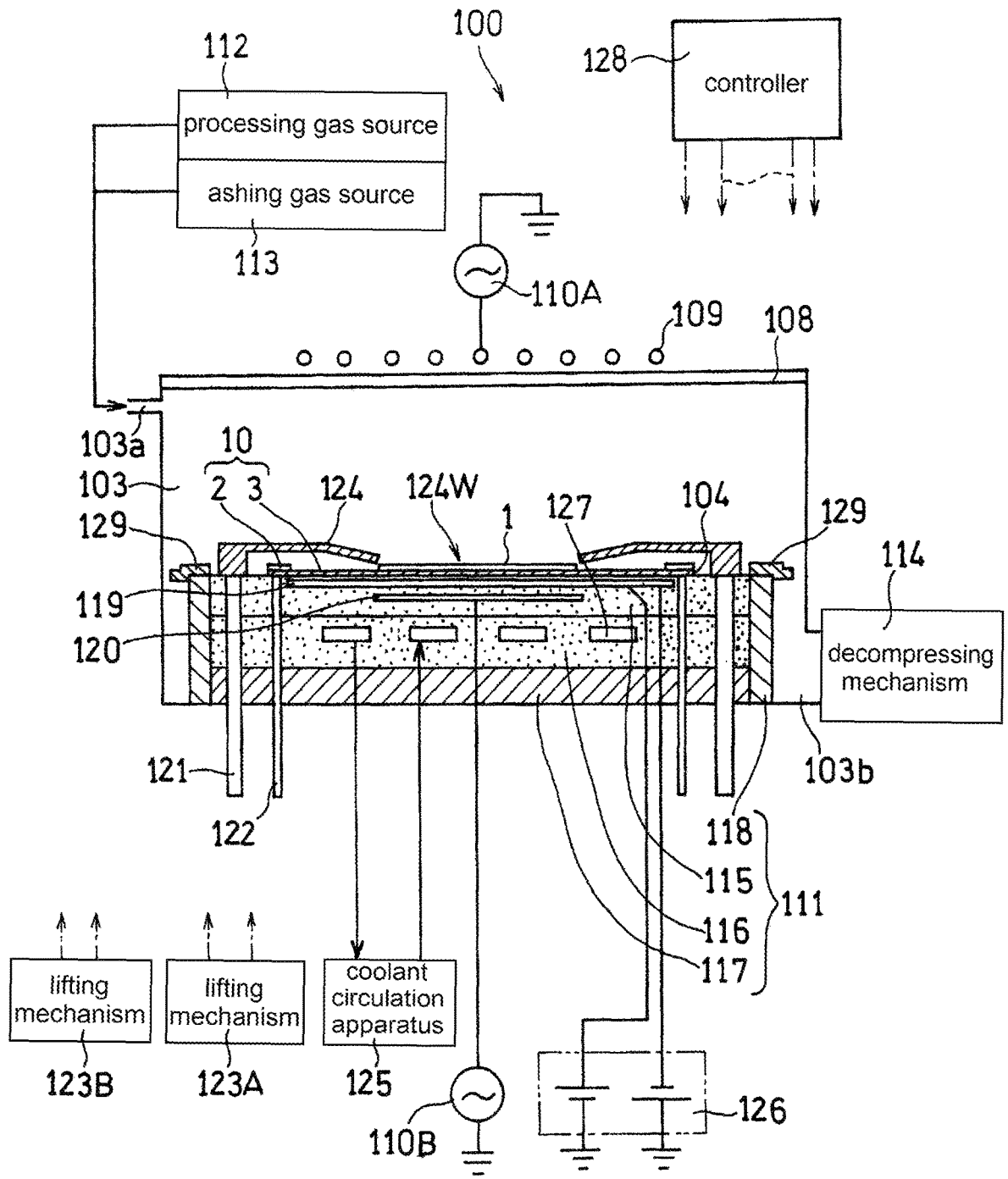
FIG. 3 is a conceptual view in a cross section depicting a schematic structure of a dry etching apparatus.

[Dry Etching Apparatus] Next, referring to FIG. 3, an example of a dry etching apparatus used in the plasma-etching step will be described hereinafter. However, the present invention is not limited to this dry etching apparatus.

The dry etching apparatus 100 includes a vacuum chamber 103 having a processing space, and a stage 111 in the processing space. The vacuum chamber 103 is provided with an inlet 103a for introducing a gas and an outlet 103b for exhausting a gas. The inlet 103a is configured to be connected selectively to one of a processing gas source 112 and an ashing gas source 113. The outlet 103b is connected to a decompressing mechanism 114 having a vacuum pump for exhausting a gas within the vacuum chamber 103 and decompressing it.

The substrate 1 held on the conveying carrier 10 (or a holding tape 3) is installed on the stage 111. The holding tape 3 has the adhesive side 3a on which the second side of the substrate 1 is adhered. The stage 111 is provided at the peripheral with a plurality of supporting members 122 which are driven by a lifting mechanism 123A to move upward and downward. The conveying carrier 10 carried in the vacuum chamber 103 is received by the supporting members 122 and installed on the stage 111.

Provided above the stage 111 is a cover 124 having a window 124W, which covers at least the frame 2 of the conveying carrier 10 and exposes the substrate 1. The cover 124 is coupled with a plurality of lifting rods 121 which are driven by a lifting mechanism 123B to move upward and downward. The upper portion of the vacuum chamber 103 is closed by a dielectric member 108, and an antenna 109 is provided as an upper electrode over the dielectric member 108. The antenna 109 is connected to a first high-frequency power 110A.

The stage 111 includes a base member 117, a metal layer 116, and an electrode layer 115, which are positioned in turn and surrounded by a peripheral member 118. Provided on an upper surface of the peripheral member is a circumferential ring 129 for protection. Arranged within the electrode layer 115 are an electrostatic chuck (ESC) electrode 119 and a high-frequency electrode 120 that is connected to a second high-frequency power 110B. The ESC electrode 119 is connected to a DC power source 126. The etching step can be carried out while applying the biasing voltage with the high-frequency power on the high-frequency electrode 120. The metal layer 116 includes a coolant channel 127 configured to cool the stage 111, through which the coolant is circulated by a coolant circulation apparatus 125.

The controller 128 controls operations of the dry etching apparatus 100 including the first high-frequency power 110A, the second high-frequency power 110B, the processing gas source 112, the ashing gas source 113, the decompressing mechanism 114, the coolant circulation apparatus 125, the lifting mechanisms 123A, 123B, and the electrostatic chucking mechanism.

[First Embodiment] Next, referring to the flowchart of FIG. 4 and the schematic operation charts of FIGS. 5A-5F, one example of the manufacturing process of the elemental chips according to the first embodiment of the present invention will be described hereinafter. In this embodiment, the substrate such as a silicon wafer is separated into the individual elemental chips.

Figure 4:
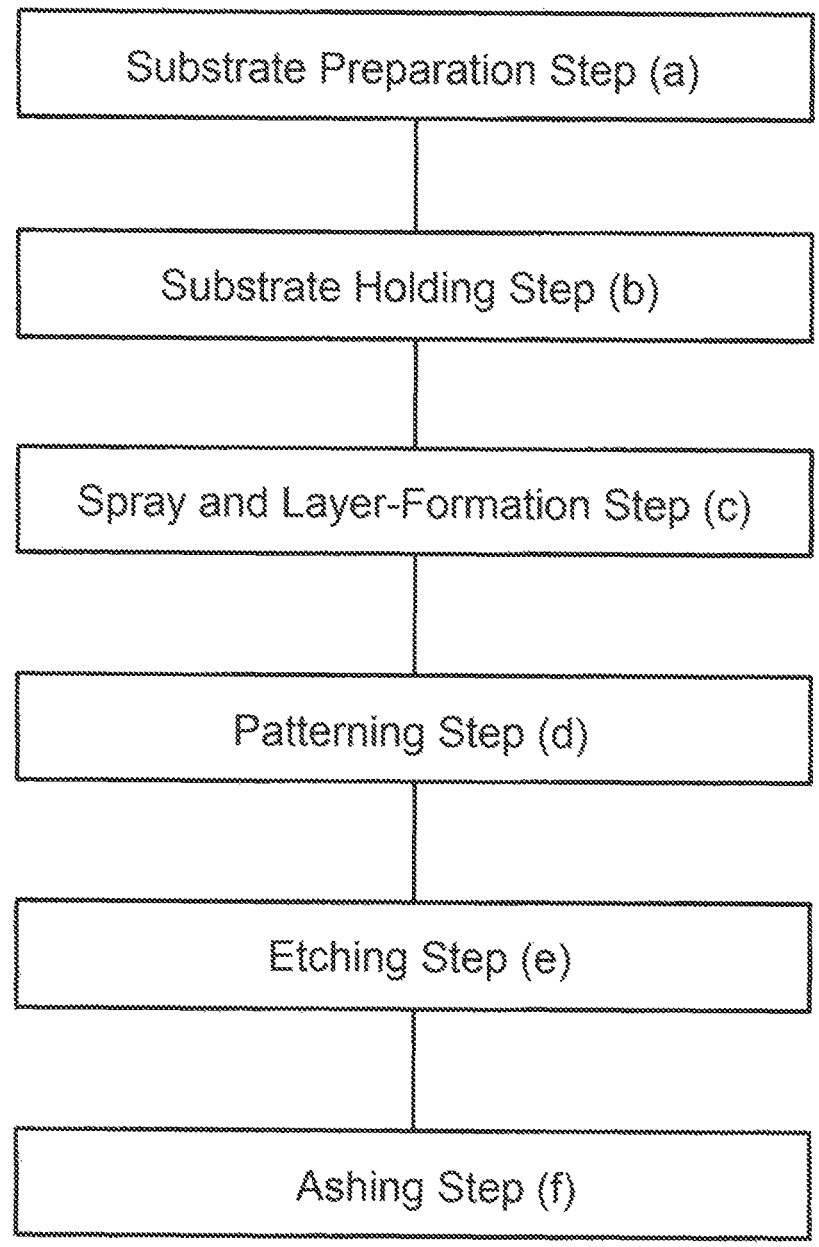
FIG. 4 is a flowchart depicting the manufacturing process of the elemental chips according to one embodiment of the present invention.
Figure 5A:
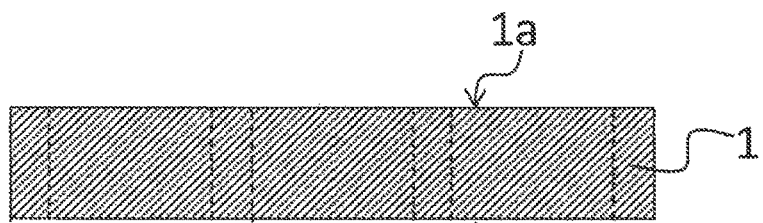
FIGS. 5A-5D are operation charts illustrating early steps of the manufacturing process of the elemental chips depicted in FIG. 4.

[(i) Preparation Step] Firstly, a semiconductor substrate is prepared at step (a) of FIG. 4 (FIG. 5A). The semiconductor substrate 1 includes the first and second sides 1a, 1b opposite each other, and it also includes a plurality of element regions R1 and a plurality of segmentation regions R2 defining each of the element regions R1. The first side 1a is one for the resist layer to be formed during the succeeding steps.

Figure 5B:

Next, the second side 1b of the semiconductor substrate 1 is adhered on the adhesive side 3a of the holding tape 3 so that the substrate 1 is held on the holding tape 3 at step (b) of FIG. 4 (FIG. 5B). This causes the annular frame 2 (not shown) held on the peripheral of the holding tape 3.

[(ii) Setting Step] Next, the spray application apparatus is prepared and the nozzle is set so as to have a length between a lower most edge of the nozzle and the first side of the substrate being in a range between 20 mm and 150 mm.

Figure 5C:
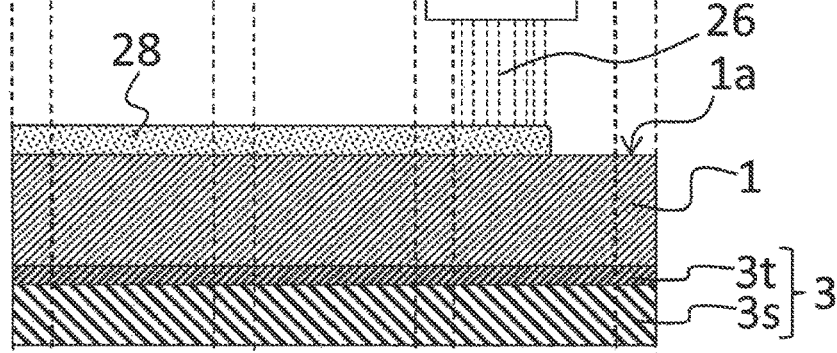

[(iii) Spray Step] Next, the resist solution is sprayed from the nozzle towards the first side 1a of the semiconductor substrate 1 at step (c) of FIG. 4 (FIG. 5C). The resist solution is sprayed from the nozzle 20 of the spray application apparatus so that minute droplets 26 of the resist solution are formed in the space (e.g., atmosphere) between the nozzle 20 and the first side 1a.

The resist solution includes, for example, resist constituents such as a resist resin, a photosensitizing agent, and additives, and a solvent. Although not limited thereto, for example, a novolac-type resin may be used as the resist resin. An acid-generating agent may be used, also for example, as the photosensitizing agent, which generates a strong organic acid through a beam radiation. In order to enhance the volatility of the solvent, it may preferably contain a methyl ethyl ketone, a propylene glycol monomethyl ether acetate, or the like.

While the resist solution may preferably contain a reduced amount of the solvent, if the amount thereof is too little, then the viscosity of the solution tends to be higher and the size of the droplets 26 obtained in the spray step tends to be larger. The amount of the solvent in the resist solution may be, for example, in a range between 15 wt. % and 50 wt. %.

[(iv) Layer-Formation Step] The droplets of the resist solution are sprayed and suspended in the space between the nozzle 20 and the first side 1a of the substrate 1, which keeps the solvent vaporizing until the concentration of the resist constituents is sufficiently high, and then the droplets of the resist solution are deposited on the first side 1a of the substrate 1. This allows the resist layer 28 containing the reduced amount of the solvent to be formed on the substrate 1 at step (c) of FIG. 4 (FIG. 5C). The amount of the solvent remained in the resist layer 28 may be controlled in a range, for example, between 5 wt. % and 20 wt. %.

The amount of the solvent remained in the resist layer 28 may preferably be controlled in the above range just after the layer-formation step (iv). Alternatively, the amount of the solvent remained in the resist layer 28 may be controlled in the above range after the end of the layer-formation step (iv) and before the beginning of the patterning step (v). For example, the resist layer may be exposed in the decompressed circumstance (e.g., 100 Pa or less) having a pressure less than the atmosphere so as to further reduce the amount of the solvent remained in the resist layer 28.

The amount of the solvent remained in the resist layer 28 can be determined by subtracting a weight of the resist layer 28 before heating the substrate at 90 degrees Celsius for 90 seconds from a weight of the substrate 1 having the resist layer 28 formed thereon. The weight of the resist layer 28 before heating can be determined by subtracting a weight of the substrate 1 with the removed resist layer 28 from the weight of the substrate 1 with the resist layer 28 formed thereon.

The thickness T of the resist layer 28 may preferably be in a range, for example, between 2 μm and 20 μm. The narrowest width W of the segmentation regions R2 may be in a range, for example, between 5 μm and 10 μm depending upon the thickness T of the resist layer 28.

Since the amount of the solvent remained in the resist layer 28 can be reduced in the layer-formation step, the deterioration of the patterning accuracy in the patterning step can be minimized, even when performing the patterning steps with the exposure and the development by the developing solution. Thus, the baking step for heating the resist layer 28 prior to the development is not required. Also when the performing the patterning steps by laser scribing of the resist layer 28, the amount of the solvent remained in the resist layer 28 can be reduced in the patterning step, the deterioration of the patterning accuracy can be inhibited. Thus, the baking step for heating the resist layer 28 prior to the radiation of the laser beam is not required. Therefore, the substrate 1 and the holding tape 3 can be maintained at 50 degrees Celsius or less during a time window between the end of the layer-formation step (iv) and the beginning of the patterning step (v).

Figure 5D:
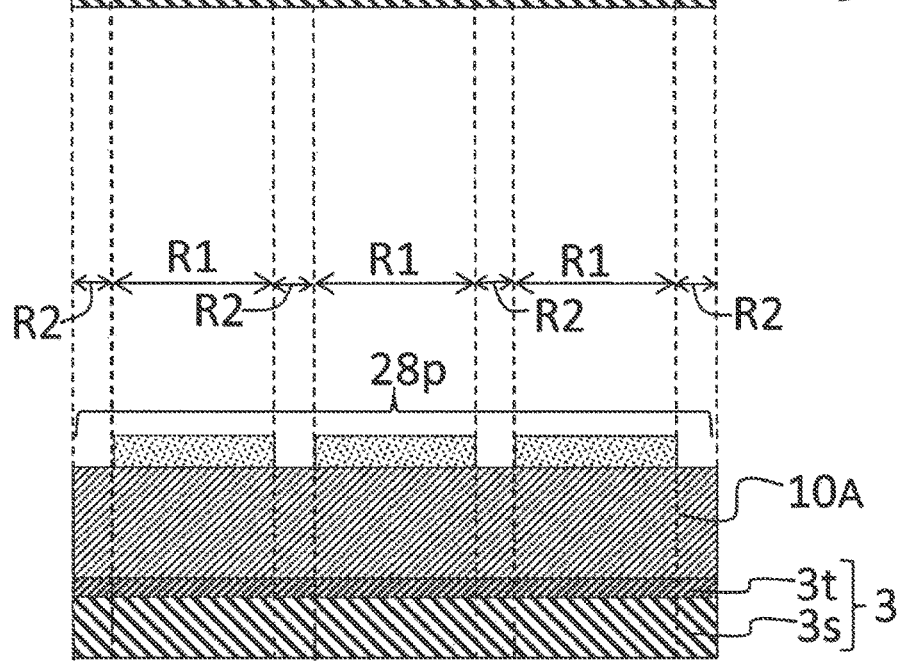

[(v) Patterning Step] Next, the first side 1a of the substrate 1 are exposed in the segmentation regions R2 by patterning the resist layer 28. It may be performed by, for example, the exposure to the resist layer 28, the development with the developing solution, and the cleaning after the development. This allows predetermined patterns 28p to be formed at step (d) of FIG. 4 (FIG. 5D). Therefore, the substrate 1 and the holding tape 3 can be maintained at 50 degrees Celsius or less between the beginning and the end of the patterning step.

The patterning step may be performed by the laser scribing technique. In this case, the segmentation regions on the first side 1a of the substrate are exposed by the laser beam and then the resist later 28 are removed so as to form the predetermined resist pattern 28P.

[(vi) Etching Step] Next, the segmentation regions R2 on the substrate 1 are etched in the plasma atmosphere. Firstly, after forming the resist pattern 28p on the first side 1a, the substrate held on the holding tape 3 of the conveying carrier 10 is introduced into the processing space of the vacuum chamber 103 of the dry etching apparatus 100 and installed on the stage 111 as illustrated in FIG. 3.

While the substrate 1 held on the holding tape 3 is installed on the stage, the processing space may be decompressed to have a pressure in a range, for example, between 0.01 Pa and 1 Pa. This facilitates further removing the solvent remained in the resist pattern 28p, thereby to enhance the accuracy of the plasma etching.

Next, the processing gas is introduced from the processing gas source 112 through the gas inlet 103a to the processing space within the vacuum chamber 103.

Figure 5E:
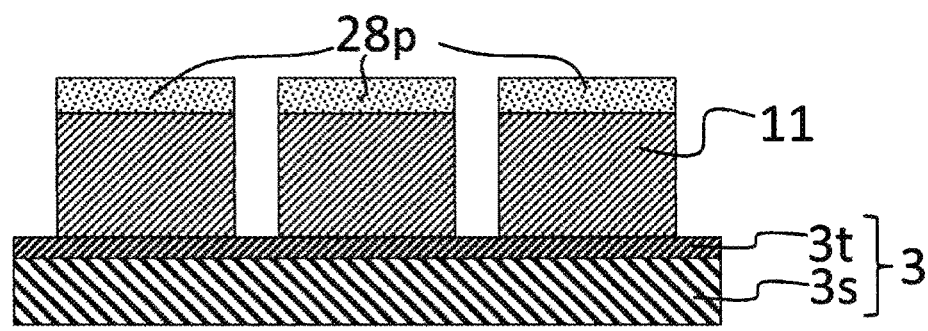
FIGS. 5E-5F are operation charts illustrating latter steps of the manufacturing process of the elemental chips depicted in FIG. 4.

When the electrostatic chuck (ESC) electrode 119 is supplied with power, the holding tape 3 is stuck on the stage 111. Subsequently, when the antenna 109 arranged above the dielectric member 108 is supplied with power from the first high-frequency source 110A so that a magnetic field is generated to excite the plasma of the processing gas. The segmentation regions R2 of the substrate 1 are etched from the first side 1a through the second side 1b. This separates the substrate 1 into a plurality of individual element chips 11 at step (e) of FIG. 4 (FIG. 5E).

The etching conditions at the etching process may be determined appropriately in accordance with the material of the semiconductor substrate 1. When the semiconductor substrate 1 is made of silicon, so-called a bosch process can be used to etch the segmentation regions R2. In the bosch process, a series of steps including a step for depositing a layer, a step for etching the deposited or protective layer, and a step for etching the silicon substrate are repeatedly performed so as to deeply drive the segmentation regions R2 of the semiconductor substrate 1 in a thickness direction.

In the step for depositing the protective layer, for example, while the processing space may be supplied with the source gas of $C_4H_8$ at a rate of 150-250 sccm to have the pressure controlled between 15-25 Pa, the antenna 109 may be applied with power of 1500-2500 W from the high-frequency source 110A, and the high-frequency electrode 120 may be applied with power of 0 W from the high-frequency source 110B for the processing time of 5-15 seconds.

In the step for etching the protective layer, for example, while the processing space may be supplied with the source gas of $SF_6$ at a rate of 200-400 sccm to have the pressure controlled between 5-15 Pa, the antenna 109 may be applied with power of 1500-2500 W from the high-frequency source 110A, and the high-frequency electrode 120 may be applied with power of 100-300 W from the high-frequency source 110B for the processing time of 2-10 seconds.

In the step for etching the silicon substrate, for example, while the processing space may be supplied with the source gas of $SF_6$ at a rate of 200-400 sccm to have the pressure controlled between 5-15 Pa, the antenna 109 may be applied with power of 1500-2500 W from the high-frequency source 110A, and the high-frequency electrode 120 may be applied with power of 50-200 W from the high-frequency source 110B for the processing time of 10-20 seconds.

Under the aforementioned conditions, the step for depositing the protective layer, the step for etching the deposited or protective layer, and the step for etching the silicon substrate are repeatedly performed so as to deeply drive the semiconductor substrate 1 at a rate of 10 μm per minute.

Figure 5F:
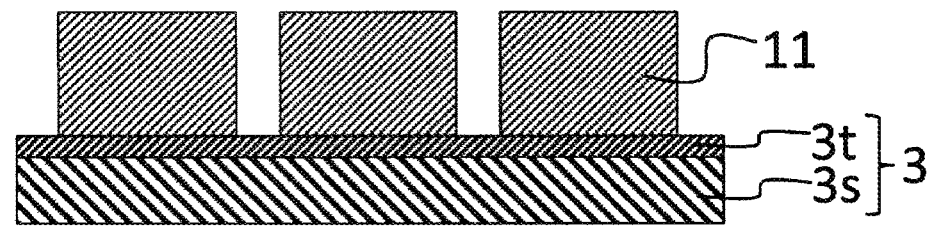

[(vii) Ashing Step] Next, another step for ashing the resist pattern 28p may be performed at t step (f) of FIG. 4 (FIG. 5F). The ashing step may successively be performed in the processing space where the etching step was done. The ashing gas (for example, oxygen gas) is introduced into the processing space from the ashing gas source 113 through the gas inlet 103a. When the high-frequency power is supplied within the processing space maintained at a predetermined pressure so as to excite the plasma, thereby removing the resist pattern 28p from the surface of the elemental chip 11.

As described above, the metal layer 116 includes a coolant channel 127 configured to cool the stage 111, through which the coolant is circulated by a coolant circulation apparatus 125. Therefore, the substrate 1 and the holding tape 3 can be maintained at 50 degrees Celsius or less also between the beginnings and the ends of the etching step and the ashing step.

[Second Embodiment]

Next, referring to the flowchart of FIG. 6 and the schematic operation charts of FIGS. 7A-7F, another example of the manufacturing process of the elemental chips according to the second embodiment of the present invention will be described hereinafter. In this embodiment, the circuit layers are formed over the first side 1a of the semiconductor substrate 1.

Figure 6:
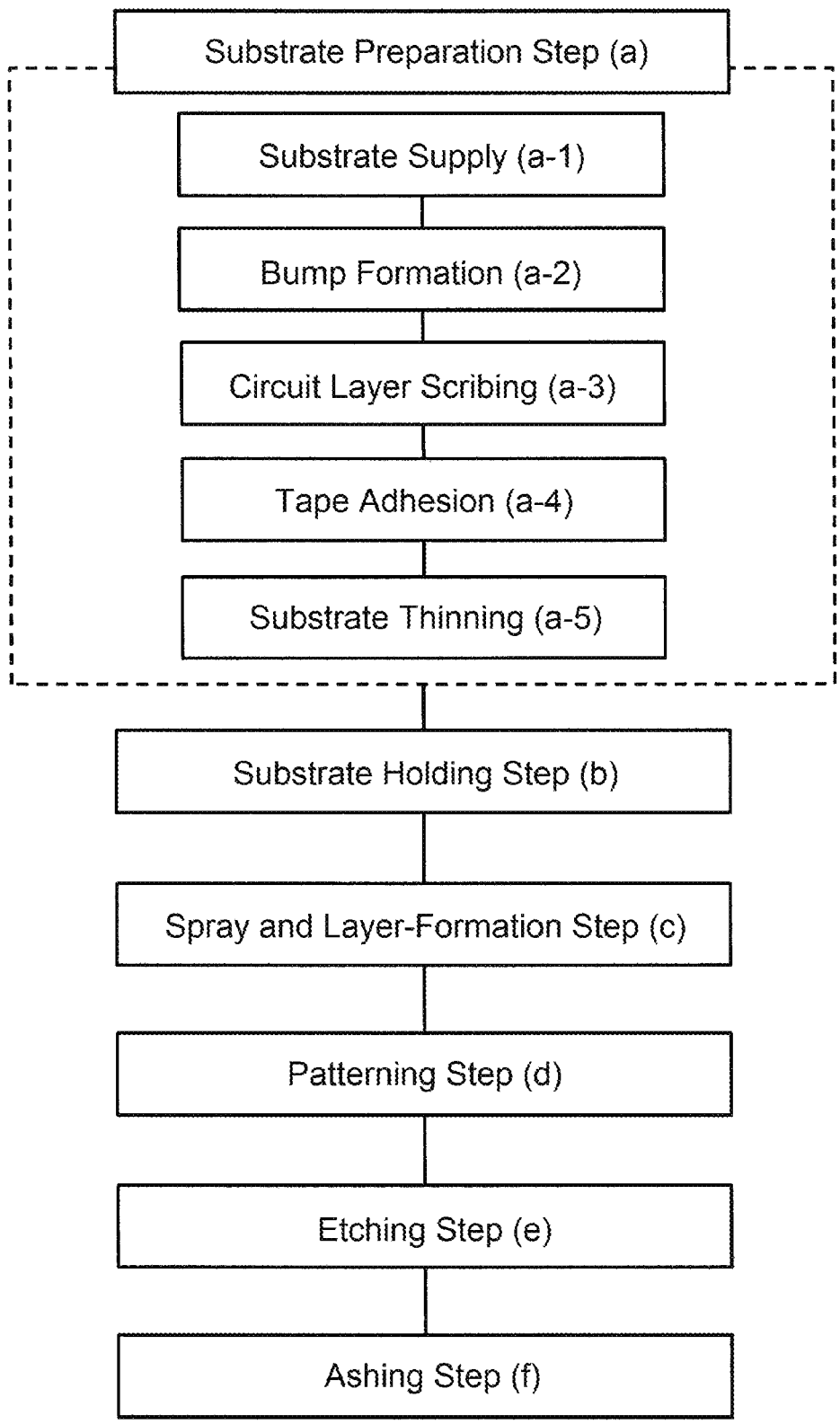
FIG. 6 is a flowchart depicting the manufacturing process of the elemental chips according to another embodiment of the present invention.

[(i) Preparation Step] Firstly, a semiconductor substrate is prepared at step (a) of FIG. 6 (FIG. 7A). The semiconductor substrate 1 includes a plurality of the element regions R1 on the second sides 1b of the substrate, and each of the element regions has the circuit layer. Although not limited thereto, the structure of the circuit layers includes a multi-layer wiring layer 30, an insulating protective layer 31 protecting the multi-layer wiring layer 30, and a plurality of bumps 32 connected to electrode portions of the multi-layer wiring layer 30 each having a projecting shape, which will be described hereinafter.

The first side 1a containing the circuit layer is covered by a back grind (BG) tape 4. The BG tape 4 is used for protecting the circuit layer in grinding the substrate on the second side 1b of the semiconductor substrate to thin the substrate. The BG tape 4 includes an adhesive layer 4t having an adhesive surface and a backing material 4s having no a non-adhesive surface. The first side 1a of the semiconductor substrate 1 is protected by the BG tape 4 with the adhesive layer 4t adhered thereon.

Figure 8A:
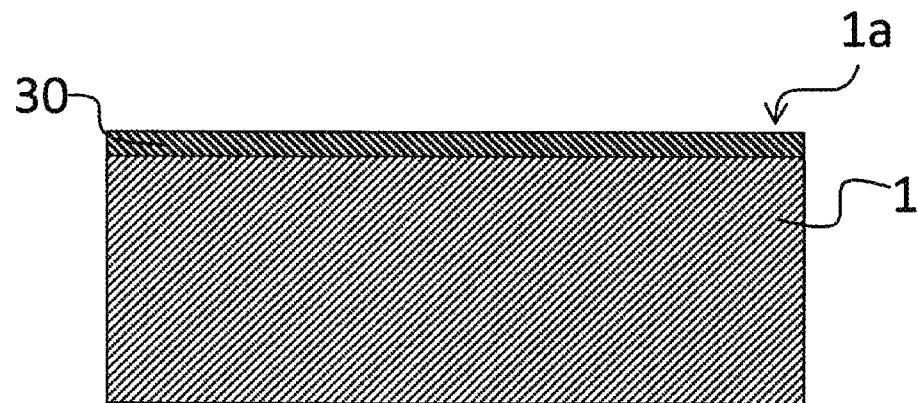
FIGS. 8A-8C are operation charts illustrating early steps of the manufacturing process of the elemental chips including circuit layers.
Figure 8B:
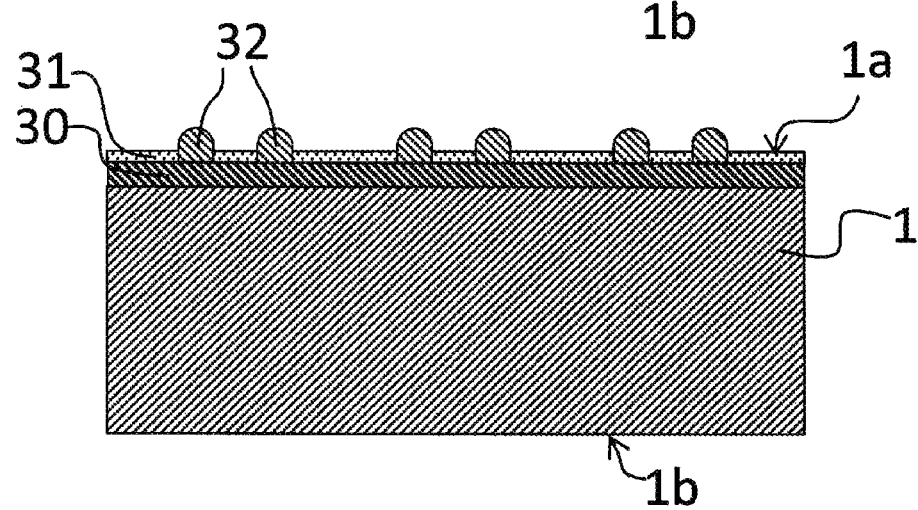

The semiconductor substrate 1 having the circuit layer on the first side 1a protected by the BG tape 4 is produced, for example, by the following steps. Firstly, the substrate having the multi-layer wiring layer 30 formed thereon is supplied at provided at step (a-1) of FIG. 6 (FIG. 8A). The protective layer 31 is formed on the multi-layer wiring layer 30 except the electrode portions, and then the projecting bumps 32 are formed on the electrode portions which extend beyond the protective layer 31, at step (a-2) of FIG. 6 (FIG. 8B). This forms the circuit layer which includes the multi-layer wiring layer 30, the protective layer 31, and the bumps 32.

Figure 8C:
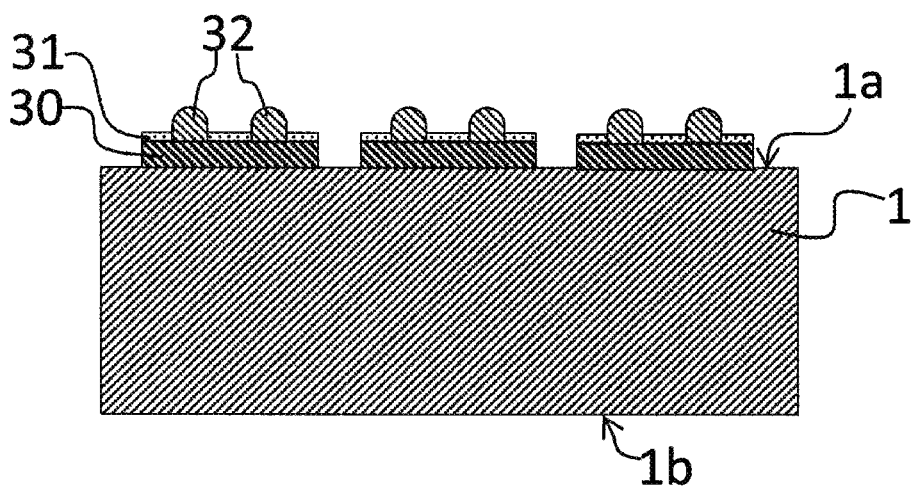

Next, the scribing technique with a laser beam or a blade, or the plasma-etching technique is used to remove the portions of the circuit layer corresponding to the segmentation regions R2 at step (a-3) of FIG. 6 (FIG. 8C).

Figure 8D:
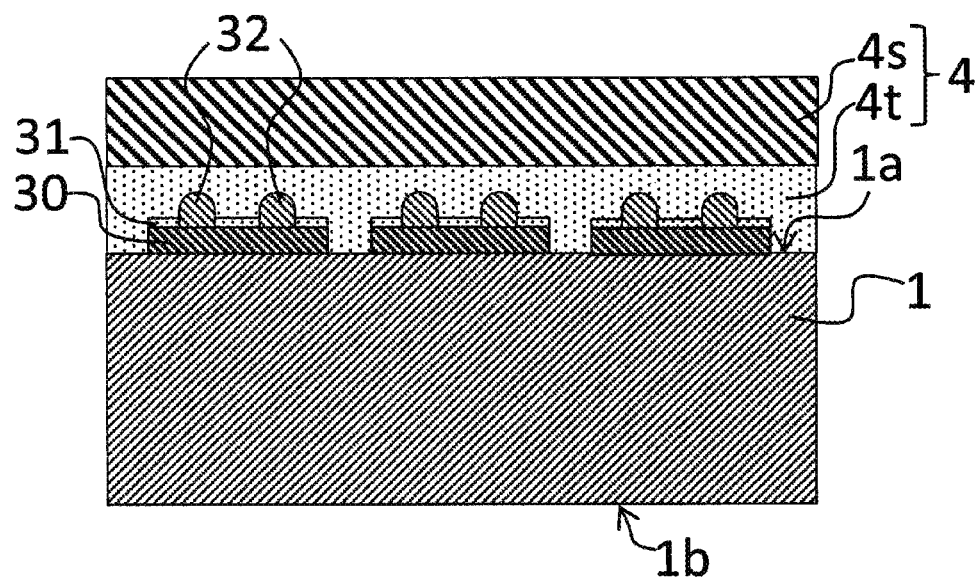
FIG. 8D-8E are operation charts illustrating latter steps of the manufacturing process of the elemental chips including circuit layers.
Figure 8E:
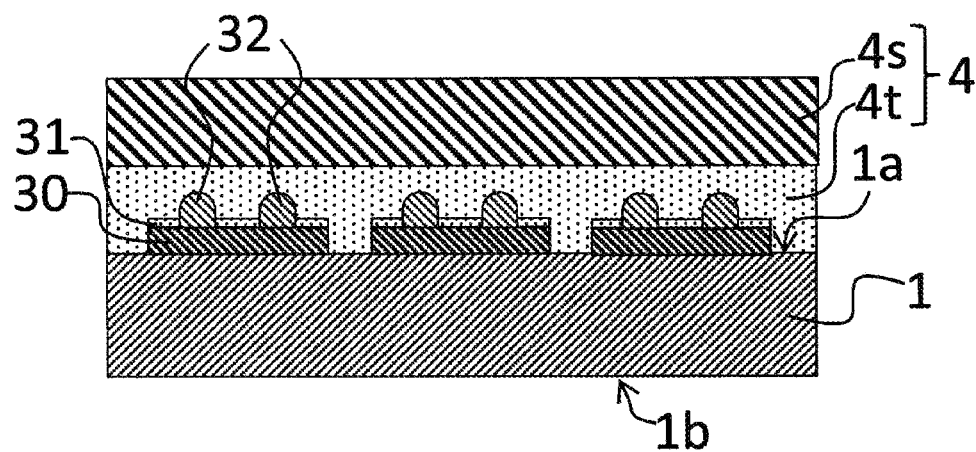

Next, the BG tape 4 is adhered on the first side 1a of the semiconductor substrate 1 to cover and protect the circuit layer at step (a-4) of FIG. 6 (FIG. 8D). Then, the second side 1b of the semiconductor substrate 1 is ground to thin the semiconductor substrate until it has a predetermined thickness, at step (a-5) of FIG. 6 (FIG. 8E). This prepares the thinned semiconductor substrate 1 of which circuit layer on the first side 1a is protected by the BG tape 4.

Next, the second side 1b of the semiconductor substrate 1 is adhered on the adhesive side 3a of the holding tape 3 so that the substrate 1 is held on the holding tape 3. Then, the BG tape 4 is peeled off the first side 1a at step (b) of FIG. 6 (FIG. 7B).

[(ii) Setting Step] Next, the spray application apparatus is prepared and the nozzle is set so as to have a length between a lower most edge of the nozzle and the first side of the substrate being in a range between 20 mm and 150 mm.

[(iii) Spray Step] Next, the resist solution is sprayed from the nozzle towards the first side 1a of the semiconductor substrate 1 having the circuit layer, at step (c) of FIG. 6 (FIG. 7C). This forms minute droplets 26 of the resist solution in the space between the nozzle 20 of the spray application apparatus and the first side 1a of the substrate 1.

[(iv) Layer-Formation Step] After the concentration of the resist constituents in the droplets of the resist solution is sufficiently increased by vaporization of the solvent, the droplets are deposited on the first side 1a of the substrate 1 to form the resist layer 28 thereon, at step (c) of FIG. 6 (FIG. 7C). Due to the little liquidity, the resist constituents are deposited and remained also on the surface of the projecting bumps 32 so as to cover the surface of the projecting bumps 32. Thus, the layer-formation step according to the present embodiment allows just the right amount of the thin resist layer 28 to cover the first side 1a of the substrate even if the first side 1a of the semiconductor substrate 1 has the circuit layer and the first side 1a has an intricate surface.

On the other hand, when the spin-coating technique or the like is used to apply the resist solution on the surface of the substrate, it is difficult to form the thin resist layer covered on the projecting portions such as bumps. In other words, in order to cover the top portions of the bumps with the resist layer, it is necessary to form the resist layer thick enough to have the top portions of the bumps buried with the resist layer. This raises the used amount of the resist solution, which is not cost-effective.

Also in the present embodiment, the solvent of the droplets may preferably be vaporized enough so that the amount of the solvent remained in the resist layer 28 is controlled in a range between about 5 wt. % and about 20 wt. %. Furthermore, the resist layer may be exposed in the decompressed circumstance during the time window between the end of the layer-formation step (iv) and the beginning of the patterning step (v).

The resist layer 28 may have a thickness T less than a height of the bumps 32 projecting from the protective layer 31. Also, the thickness T of the resist layer 28 may be less than a depth of trenches (i.e., corresponding to the total thickness of the multi-layer wiring layer 30 and the protective layer 31) formed by removing the circuit layer along the segmentation regions R2.

[(v) Patterning Step] Next, the first side 1a of the substrate 1 are exposed in the segmentation regions R2 by patterning the resist layer 28. This allows predetermined patterns 28p to be formed at step (d) of FIG. 6 (FIG. 7D).

Figure 7E:
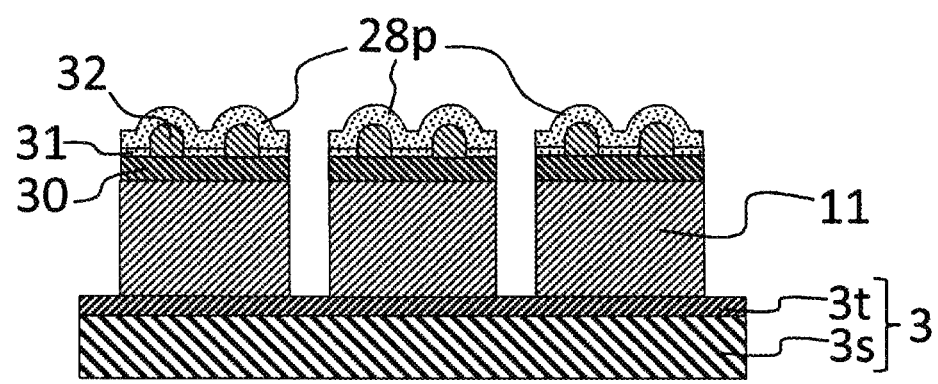
FIGS. 7E-7F are operation charts illustrating latter steps of the manufacturing process of the elemental chips depicted in FIG. 6.

[(vi) Etching Step] Next, the segmentation regions R2 on the substrate 1 are etched in the plasma atmosphere at step (e) of FIG. 6 (FIG. 7E). Since the resist pattern 28p covers the circuit layer up to the top portions of the bumps, the bumps 32 are not plasma-etched during this etching step.

Figure 7F:
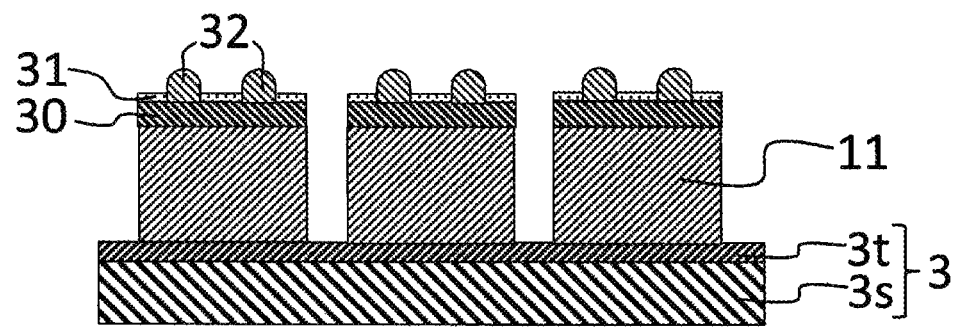

[(vii) Ashing Step] Next, another step for ashing the resist pattern 28p may be performed at t step (f) of FIG. 6 (FIG. 7F). This produces a plurality of the elemental chips 11 each having the circuit layer.

As mentioned above, the layer-formation step according to the present embodiment allows just the right amount of the thin resist layer 28 to cover the first side 1a of the substrate even if the first side 1a of the semiconductor substrate 1 has the circuit layer and the first side 1a has an intricate surface. Therefore, when comparing to the case where the resist layer is applied on the surface of the substrate by means of the spin-coating technique, the deviation of the thickness of the resist layer 28 can be reduced and the time required for the ashing step can be shortened.

INDUSTRIAL APPLICABILITY

The process for manufacturing the elemental chips according to the present invention includes a step for plasma-etching the substrate held on the holding tape by means of the dry-etching apparatus, achieving an advantage that the thin substrate having the thickness, e.g., 150 µm or less, can be separated into a plurality of elemental chips.

DESCRIPTION OF REFERENCE NUMERALS

1: substrate (semiconductor substrate), 1a: first side, 1b: second side,
2; frame, 2a: notch, 2b corner-cut,
3: holding tape, 3a: adhesive side, 3b: non-adhesive side, 3s: backing film, 3t: adhesive layer,
4: back grind tape, 4s: backing material, 4t: adhesive layer,
R1: element regions, R2: segmentation regions,
10: conveying carrier, 11: elemental chip,
20: nozzle, 22: transverse rail, 24: vertical rail, 26: droplet of the resist solution,
28: resist layer, 28p: resist pattern, 30: multi-layer wiring layer, 31: protective layer, 32: bump,
100: dry-etching apparatus, 103: vacuum chamber, 103a: gas inlet, 103b: gas outlet,
108: dielectric member, 109: antenna, 110A: first high-frequency source,
110B: second high-frequency source, 111: stage, 112: processing gas source, 113: ashing gas source, 114: decompressing mechanism,
115: electrode layer, 116: metal layer, 117: base member, 118: peripheral member,
119: ESC electrode, 120: high-frequency electrode, 121: lifting rod, 122: supporting member,
123A, 123B: lifting mechanism, 124: cover, 124W: window, 125: coolant circulation apparatus,
126: DC power source, 127: coolant channel, 128: controller, 129: circumferential ring

What is claimed is:

1. A manufacturing process of an elemental chip, comprises:
    a preparation step for preparing a substrate held on a holding tape, the substrate including first and second sides opposite each other and the second side thereof being held on the holding tape, and the substrate further including a plurality of element regions and a plurality of segmentation regions defining each of the element regions;
    a setting step for setting a nozzle, a length between a lower most edge of the nozzle and the first side of the substrate being in a range between 20 mm and 150 mm,
    a spray step for spraying a resist solution from the nozzle to form droplets of the resist solution, the resist solution containing a resist constituent and a solvent;
    a layer-formation step for forming a resist layer by vaporizing the solvent from the droplets and depositing the resist constituent on the first side of the substrate that is held on the holding tape such that an amount of the solvent remained in the droplets becomes in a range between 5 wt. % and 20 wt. % when deposited to form the resist layer on the first side of the substrate;
    a patterning step for patterning the resist layer to expose the first side of the substrate in the segmentation regions; and
    an etching step for plasma-etching the substrate on the first side exposed in the segmentation regions thereof.

2. The manufacturing process according to claim 1, wherein the substrate and the holding tape are maintained at 50 degrees Celsius or less during a time window between the beginning of the spray step and the beginning of the patterning step.

3. The manufacturing process according to claim 1, further comprising:
    a removing step for removing the solvent remained in the resist layer by exposing the resist layer in the decompressed circumstance having a pressure less than the atmosphere after the end of the layer-formation step and before the beginning of the patterning step.

4. The manufacturing process according to claim 1, wherein the solvent contains a methyl ethyl ketone.

5. The manufacturing process according to claim 1, wherein the solvent contains a propylene glycol monomethyl ether acetate.

6. The manufacturing process according to claim 1, wherein an amount of the solvent in the resist solution is in a range between 15 wt % and 50 wt %.

7. The manufacturing process according to claim 1, wherein when the resist constituent is deposited on the first side of the substrate that is held on the holding tape, the resist constituent has little liquidity.

* * * * *